United States Patent [19]
Ito et al.

[11] Patent Number: 5,508,226
[45] Date of Patent: Apr. 16, 1996

[54] LOW TEMPERATURE PROCESS FOR FABRICATING LAYERED SUPERLATTICE MATERIALS AND MAKING ELECTRONIC DEVICES INCLUDING SAME

[75] Inventors: Takeshi Ito; Carlos A. Paz de Araujo, both of Colorado Springs, Colo.; Hitoshi Watanabe, Tokyo, Japan; Michael C. Scott, Colorado Springs, Colo.

[73] Assignees: Symetrix Corporation, Colorado Springs, Colo.; Olympus Optical Co., Ltd., Tokyo, Japan

[21] Appl. No.: 407,760

[22] Filed: Mar. 21, 1995

Related U.S. Application Data

[63] Continuation-in-part of Ser. No. 65,656, May 21, 1993, Pat. No. 5,434,102, which is a continuation-in-part of Ser. No. 981,133, Nov. 24, 1992, Pat. No. 5,423,285, and a continuation-in-part of Ser. No. 965,190, Oct. 23, 1992, abandoned, each is a continuation-in-part of Ser. No.807,439, Dec. 13, 1991, abandoned.

[51] Int. Cl.$^6$ .................................................. H01L 29/15
[52] U.S. Cl. .............. 437/130; 117/90; 437/133
[58] Field of Search .............. 117/90, 92; 427/126.3; 437/130, 133

[56] References Cited

U.S. PATENT DOCUMENTS

| | | | |
|---|---|---|---|
| 5,046,043 | 9/1991 | Miller et al. | 365/145 |
| 5,423,285 | 6/1995 | Paz de Araujo et al. | 117/90 |
| 5,434,102 | 7/1995 | Watanabe et al. | 437/130 |
| 5,439,845 | 8/1995 | Watanabe et al. | 437/130 |

*Primary Examiner*—R. Bruce Breneman
*Assistant Examiner*—Felisa Gannett
*Attorney, Agent, or Firm*—Duft, Graziano & Forest

[57] ABSTRACT

A liquid precursor containing a metal is applied to a first electrode, RTP baked at a temperature of 700° C., and annealed at the same temperature for from 3 to 5 hours to form a layered superlattice material. A second electrode is formed to form a capacitor, and a second anneal is performed at a temperature of 700° C. If the material is strontium bismuth tantalate, the precursor contains u mole-equivalents of strontium, v mole-equivalents of bismuth, and w mole-equivalents of tantalum, where $0.8 \leq u \leq 1.0$, $2.0 \leq v \leq 2.3$, and $1.9 \leq w \leq 2.1$.

30 Claims, 8 Drawing Sheets

LOW TEMPERATURE PROCESS FOR FABRICATING LAYERED SUPERLATTICE MATERIALS AND MAKING ELECTRONIC DEVICES INCLUDING SAME

This application is a continuation-in-part of U.S. patent application Ser. No. 08/065,656 filed May 21, 1993, now U.S. Pat. No. 5,434,102 which is a continuation-in-part of U.S. patent applications Ser. No. 07/981,133 filed Nov. 24, 1992, now U.S. Pat. No. 5,423,285, and 7/965,190 filed Oct. 23, 1992, now abandoned, which in turn are continuations-in-part of U.S. patent application Ser. No. 07/807,439 filed Dec. 13, 1991, now abandoned.

BACKGROUND OF THE INVENTION

1. Field of the Invention

The invention in general relates to the fabrication of layered superlattice materials, and more particularly to fabrication processes that provide highpolarizability and low fatigue ferroelectric integrated circuit devices and low-leakage current high dielectric constant integrated circuit devices using low processing temperatures.

2. Statement of the Problem

It has been well-known for at least 30 years that if a memory utilizing the polarizability property of ferroelectric materials could be made, such a memory would be non-volatile, of high density, and have many other advantages. See, for example, U.S. Pat. No. 5,046,043 issued to William D. Miller et al. Moreover, it is also well-known that the substitution of high dielectric constant materials for the silicon dioxide of conventional memories such as DRAM's could result in memories that were much more dense. See, for example, European patent application Serial No. 0 415 751 A1 of NEC Corporation. Thus, a large amount of research has been performed for many years to obtain materials with suitable ferroelectric properties and suitable high dielectric constant properties. However, up to the time of the above-mentioned patent copending applications, no one had been able to find a material that had ferroelectric properties or high dielectric properties that made it suitable for fabricating a practical ferroelectric memory or dielectric memory with a suitably high dielectric constant. All ferroelectric materials with suitably high polarizabilities fatigued, and all dielectric materials with suitably high dielectric constant had excessive leakage currents. The above-mentioned copending patent applications disclose that layered superlattice materials, such as strontium bismuth tantalate, have excellent properties in ferroelectric and high dielectric constant applications as compared to the best prior materials, such as PZT. The capacitor memory designs disclosed in the above copending applications, usually included platinum electrodes.

It is known that platinum adheres to silicon only with difficulty, and that a titanium layer placed between a platinum electrode and a silicon substrate will significantly increase the adhesion of the platinum to the substrate. Thus, practical memory designs that can be manufactured using layered superlattice materials and platinum electrodes, generally include an adhesion layer.

The above applications disclose that annealing temperatures of about 800° C. are required to obtain the best electrical properties, such as polarizability greater than about 15 microcoulombs/cm$^2$. While temperatures of 800° C. were lower than temperatures of the prior art used to make such materials, there still remained some atomic migration through boundaries, like electrodes, at this temperature. For example, titanium used as adhesion layers in electrodes migrated to the ferroelectric material and to the silicon. This atomic migration sometimes changed contact resistances and other properties, thus making it difficult to use the layered superlattice materials with transistors and other conventional electrical components made with conventional silicon technology.

SUMMARY OF THE INVENTION

The present invention provides a fabrication process that utilizes only temperatures less than 725° C., and preferably about 700° C. or less, to fabricate high quality layered integrated circuit devices utilizing layered superlattice materials.

The invention provides a method of fabricating a layered superlattice material comprising the steps of: providing a substrate, and a precursor containing metal moieties in effective amounts for spontaneously forming a layered superlattice material upon drying and annealing the precursor; applying the precursor to the substrate; drying the precursor to form a solid material on the substrate; and annealing the solid material at a temperature of between 600° C. and 725° C. to form the layered superlattice material on the substrate. Preferably, the step of drying comprises rapid thermal processing the precursor at a temperature of up to 725° C. Preferably, the rapid thermal processing temperature is about 700° C. Preferably, the step of annealing comprises annealing the material for at least three hours, and up to five hours. Preferably, the annealing temperature is about 700° C. Preferably, the substrate comprises a first electrode, and further comprising the steps of forming a second electrode on the layered superlattice material, after the step of annealing, to form a capacitor, and subsequently performing a second anneal at a temperature of up to 725° C. Preferably, the second anneal temperature is about 700° C. Preferably, the wafer is an integrated circuit wafer and further including the step of completing the fabrication of the integrated circuit wafer to form a plurality of interconnected electrical devices on the wafer. Preferably, the layered superlattice material comprises strontium bismuth tantalate. Preferably, the precursor includes u mole-equivalents of strontium, v mole-equivalents of bismuth, and w mole-equivalents of tantalum, and $0.8 \leq w \leq 1.0$, $2.0 \leq v \leq 2.3$, and $1.9 \leq w \leq 2.1$. Preferably, $u=0.85$, $v=2.2$, and $w=2$, or alternatively, $u=0.9$, $v=2.1$, and $w=2$. Preferably, the step of providing a substrate comprises forming an adhesion layer and then forming an electrode on the adhesion layer. Preferably, the adhesion layer comprises titanium and the electrode comprises platinum.

In another aspect the invention provides a method of fabricating a layered superlattice material comprising the steps of: providing a substrate, and a precursor containing metal moieties in effective amounts for spontaneously forming a layered superlattice material upon heating the precursor; applying the precursor to the substrate; and heating the precursor on the substrate to a temperature of between 450° C. and 700° C. to form the layered superlattice material on the substrate.

In a further aspect, the invention provides a method of fabricating a layered superlattice material comprising the steps of: providing a substrate and a precursor containing metal moieties in effective amounts for spontaneously forming a layered superlattice material upon heating the precursor; forming an adhesion layer on the substrate; forming an electrode on the adhesion layer; applying the precursor to the substrate; and heating the precursor on the substrate to a temperature of about 700° C. to form the layered superlattice material on the substrate. Preferably, the step of heating comprises rapid thermal processing at a temperature of about 700° C. and then annealing at a temperature of about 700° C.

In still another aspect, the invention provides a method of fabricating a layered superlattice material comprising the steps of: providing a substrate, and a precursor containing u mole-equivalents of strontium, v mole-equivalents of bismuth, and w mole-equivalents of tantalum, where $0.8 \leq u \leq 1.0$, $2.0 \leq v \leq 2.3$, and $1.9 \leq w \leq 2.1$; applying the precursor to the substrate; and heating the precursor on the substrate to form a thin film of strontium bismuth tantalate on the substrate. Preferably, u=0.85, v=2.2, and w=2, or, alternatively, u=0.9, v=2.1, and w=2.

The preferred method described above involves only temperatures of 700° C. or lower, yet results in layered superlattice materials with excellent electronic properties. For example, ferroelectric layered superlattice materials with polarizabilities, 2Pr, higher than 20 microcoulombs per square centimeter have been fabricated. Significantly, it is found that on a Pt/Ti electrode, the 700° C. process provides a higher polarizability than a 800° C. process. Numerous other features, objects and advantages of the invention will become apparent from the following description when read in conjunction with the accompanying drawings.

DESCRIPTION OF THE PREFERRED EMBODIMENT

1. Overview.

Figure 2:
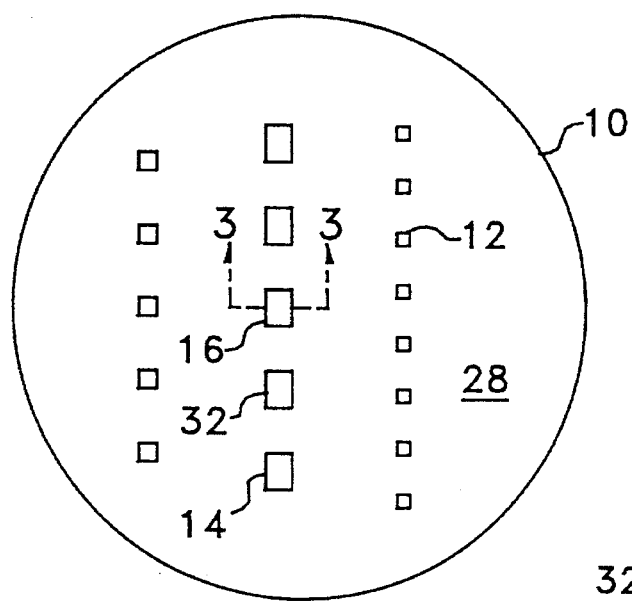
FIG. 2 is a top view of a wafer on which thin film capacitors fabricated by the process according to the invention are shown greatly enlarged.
Figure 3:
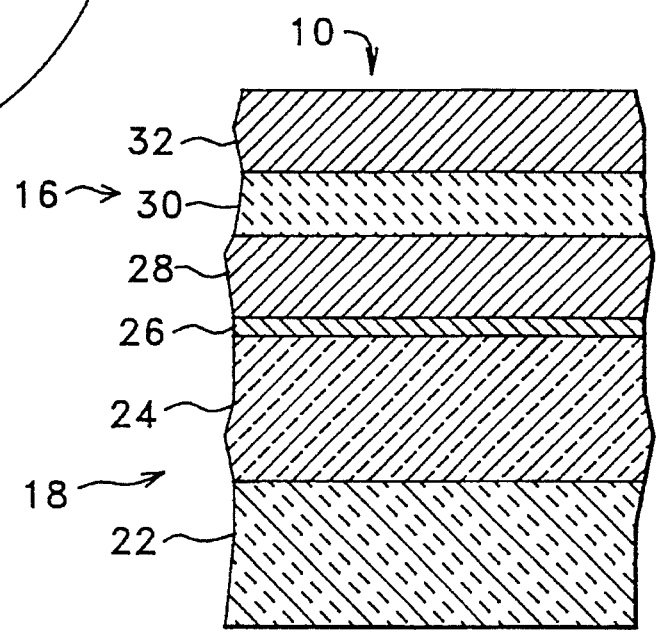
FIG. 3 is a portion of a cross-section of FIG. 2 taken through the lines 3—3, illustrating a thin film capacitor device fabricated by the process of FIG. 1.

Directing attention to FIGS. 2 and 3, a wafer 10 containing numerous capacitors 12, 14, 16, etc. is shown. FIG. 2 is a top view of the wafer 10 on which the thin film capacitors 12, 14, 16, etc. fabricated by the process according to the invention are shown greatly enlarged. FIG. 3 is a portion of a cross-section of FIG. 2 taken through the lines 3—3 bisecting capacitor 16. Referring to FIG. 3, the wafer 10 includes a silicon substrate 22, a silicon dioxide insulating layer 24, a thin layer of titanium 26 which assists the next layer, which is a platinum electrode 28, in adhering to the silicon dioxide 24, a layer of layered superlattice material 30, and another platinum electrode 32. After the layers 24, 26, 28, 30, and 32, are deposited, the wafer is etched down to layer 28 to form the individual capacitors 12, 14, 16, etc. which are interconnected by the bottom electrode 28. The invention primarily involves the method of creating the layer 30 of layered superlattice material. Layered superlattice materials comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices. Generally each layered superlattice material will include two or more of the above metals; for example, barium, bismuth and niobium form the layered superlattice material barium bismuth niobate, $BaBi_2Nb_2O_9$. The material 30 may be a dielectric, a ferroelectric, or both. If it is a dielectric, the capacitor 16 is a dielectric capacitor, and if the material 30 is a ferroelectric, then capacitor 16 is a ferroelectric capacitor. The layered superlattice materials may be summarized more generally under the formula:

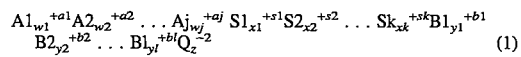

(1)

where A1, A2 . . . Aj represent A-site elements in the perovskite-like structure, which may be elements such as strontium, calcium, barium, bismuth, lead, and others $1, S2 . . . Sk represent super-lattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 ... wj all equal zero. If there is only one B-site element in the compound, then it is represented by the "B1" element, and y2 ... yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(2) \quad (a1w1+a2W2 \ldots ajwj)+(s1x\ 1+s2x2 \ldots skxk)+(b1y1+b2y2 \ldots + bjyj)=2z.$$

Formula (1) includes all three of the Smolenskii type compounds. The layered superlattice materials do not include every material that can be fit into the formula (1), but only those which spontaneously form themselves into crystalline structures with distinct alternating layers.

It should also be understood that the term layered superlattice material herein also includes doped layered superlattice materials. That is, any of the material included in formula (1) may be doped with a variety of materials, such as silicon, germanium, uranium, zirconium, tin or hafnium. For example, strontium bismuth tantalate may be doped with a variety of elements as given by the formula:

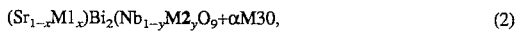

$$(Sr_{1-x}M1_x)Bi_2(Nb_{1-y}M2_yO_9+\alpha M3O, \quad (2)$$

where M1 may be Ca, Ba, Mg, or Pb, M2 may be Ta, Bi, or Sb, with x and y being a number between 0 and 1 and preferably $0 \leq x \leq 0.2, 0 \leq y \leq 0.2$, M3 may be Si, Ge, U, Zr, Sn, or Hf, and preferably $0 \leq \alpha 0.06$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-x)SrBi_2Ta_2O_9+xABO_3, \quad (3)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant, For example, a material according to the formula:

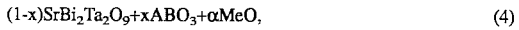

$$(1-x)SrBi_2Ta_2O_9+xABO_3+\alpha MeO, \quad (4)$$

where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

Figure 4:
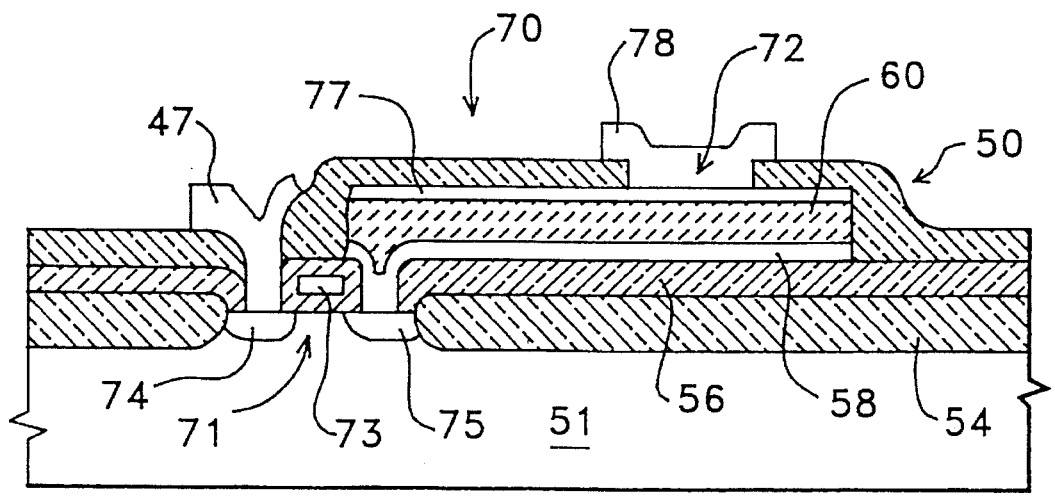
FIG. 4 is a cross-sectional illustration of a portion of an integrated circuit fabricated utilizing the process of the invention.

FIG. 4 shows an example of the integration of a layered superlattice capacitor 72 into a DRAM memory cell to form an integrated circuit 70 such as may be fabricated using the invention. The memory cell 50 includes a silicon substrate 51, field oxide areas 54, and two electrically interconnected electrical devices, a transistor 71 and a ferroelectric switching capacitor 72. Transistor 71 includes a gate 73, a source 74, and a drain 75. Capacitor 72 includes first electrode 58, ferroelectric layered superlattice material 60, and second electrode 77. Insulators, such as 56, separate the devices 71, 72, except where drain 75 of transistor 71 is connected to first electrode 58 of capacitor 72. Electrical contacts, such as 47 and 78 make electrical connection to the devices 71, 72 to other parts of the integrated circuit 70. A detailed example of the complete fabrication process for an integrated circuit memory cell as shown in FIG. 4 is given in U.S. patent application Ser. No. 919,186, which is incorporated herein by reference. It should be understood that FIGS. 2, 3, 4 depicting the capacitors 12, 14, 16, etc. and integrated circuit 70 are not meant to be actual cross-sectional views of any particular portion of an actual electronic device, but are merely idealized representations which are employed to more clearly and fully depict the structure and process of the invention than would otherwise be possible.

This disclosure describes the fabrication and testing of numerous capacitors 12, 14, 16 having layers 22, 24, 26, 28, 30, and 32 made of the materials above, disclosing a wide spectrum of variations of the fabrication process according to the invention and a variety of different layered superlattice materials 30. It should be understood, however, that the specific processes and electronic devices described are exemplary; that is the invention contemplates that the layers in FIGS. 3 and 4 may be made of many other materials than those mentioned above and described below, there are many other variations of the process of the invention than can be included in a document such at this, and the method and materials may be used in many other electronic devices other than the capacitors, such as 12, 14, 16, etc. and the integrated circuit 70. It should also be noted that the word "substrate" is used in both a specific and a general sense in this disclosure. In the specific sense it refers to the specific silicon layer 22, conventionally called a silicon substrate, on which the exemplary electronic devices described are fabricated. In a general sense, it refers to any material, object, or layer on which another layer or layers are formed. In this sense, for example, the layers 22, 24, 26, and 28 comprise a substrate 18 for the layer 30 of layered superlattice material 30.

A term that is used frequently in this disclosure is "stoichiometry" or "stoichiometric". As used herein, the term stoichiometric generally expresses a relationship between the precursor solution and the final layered superlattice film 30. A "stoichiometric precursor" is one in which the relative proportions of the various metals in the precursor is the same as the proportion in a homogeneous specimen of the intended final layered superlattice thin film 30. This proportion is the one specified by the formula for the final thin film 30.

2. Detailed Description of the Fabrication Process

Figure 1:
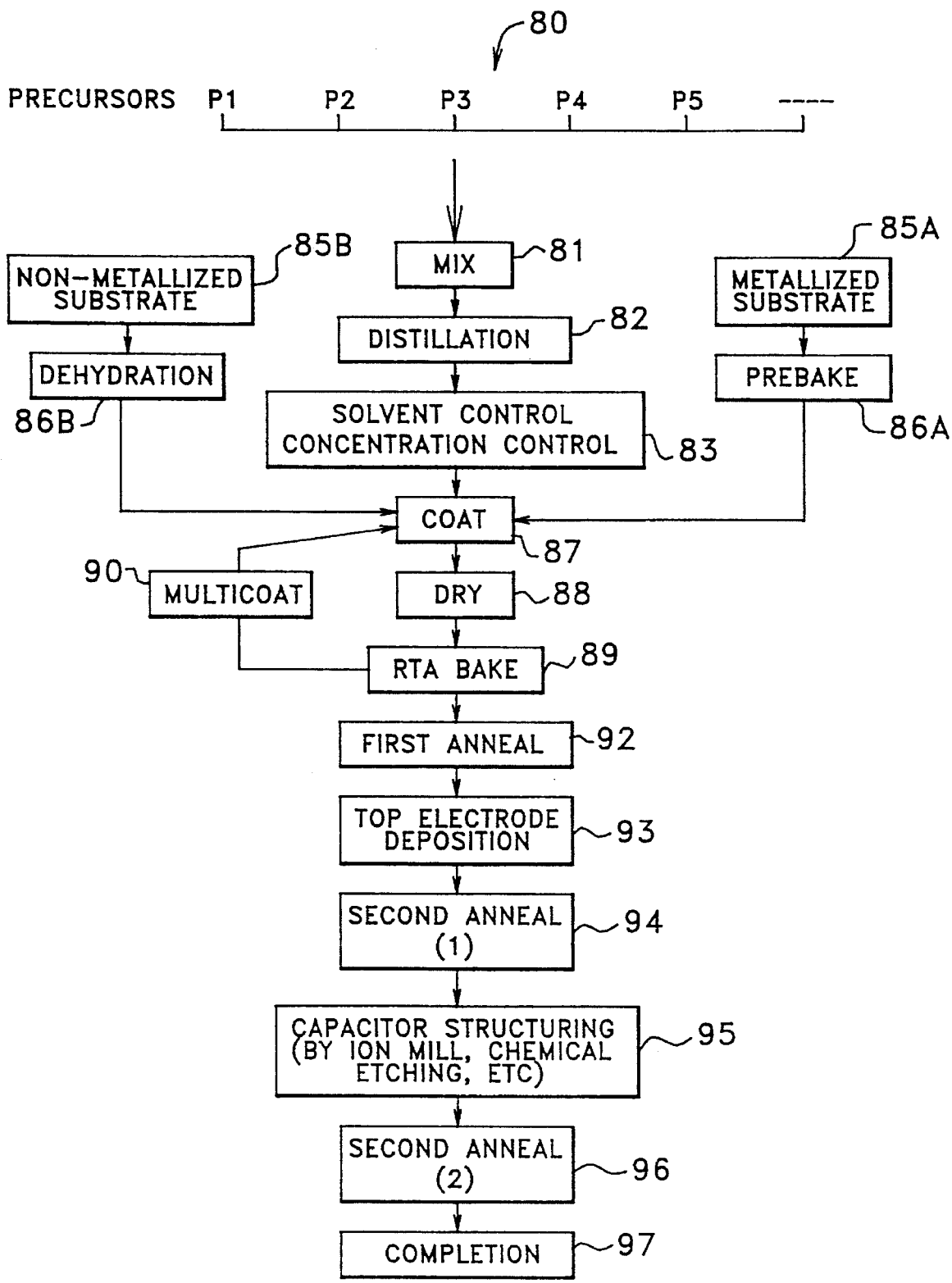
FIG. 1 is a flow chart showing the preferred embodiment of a process for preparing a thin film of a layered superlattice material according to the invention.

Turning now to a more detailed description of the invention, a flow chart of the preferred embodiment of a process according to the invention for preparing a thin film of a layered superlattice material, such as 30 and 60, and a device, such as 10 and 70 incorporating the material 30 and 60, is shown in FIG. 1. We shall first review each step of the preferred process briefly, and then discuss the individual steps in more detail and provide examples of the process. The first step 80 of the process is the preparation of the precursor or precursors, P1, P2, P3, etc. In the preferred embodiment the precursors are liquids in which a compound or compounds of the metals to comprise the layered superlattice material 30 are dissolved. The precursors are then mixed in step 81, and the mixed precursors are distilled in step 82. Then follows a solvent control and/or concentration control step 83. Generally this step is taken over two stages which may be separated considerably in time. In the first stage the mixed precursor is dissolved in a suitable solvent and concentrated so as to provide a long shelve life. Just before use, the solvent and concentration may be adjusted to optimize the electronic device that results from the process. The final precursor contains metal moieties in effective amounts for spontaneously forming the desired layered superlattice material upon drying and annealing said precursor.

In parallel with the solvent and concentration control step 83, the substrate 18 is prepared. If the substrate is a metallized substrate, such as the substrate 18, then the substrate is provided in step 85A by forming the layers 22, 24, 26, and 28 and is then prebaked in step 86A. If the substrate is a non-metallized substrate, such as a silicon or gallium arsenide single crystal, the substrate is provided in step 85B and dehydrated in step 86B. In step 87 the substrate is coated with the precursor. In the examples discussed below, the coating was done by a spin-on process, though a process such as a misted deposition process as described in U.S. patent application Ser. No. 993,380, which is hereby incorporated by reference, or dipping or other suitable coating process may be used. The coated substrate is then dried in step 88, and then baked in an RTP (rapid thermal processor) unit. If the desired thickness of the layer 30 is not obtained, then the series of coat, dry, and RTP bake steps 87, 88, and 89 are repeated as many times as required to build up the desired thickness. The wafer 10 is then annealed in step 92, the top or second electrode 32 is deposited in step 93 by sputtering or other suitable process, and the wafer 10 is then, optionally, annealed again in step 94. The capacitor 16 is then structured by ion milling, chemical etching, or other suitable process in step 95. Then follows, in step 96, a second "second anneal" step, which will be the third anneal if step 94 was done. This completes the process if a capacitor device as in FIG. 2 is the desired end result, however in the case of an integrated circuit as in FIG. 4, there follows completion steps 97 such as contact metalization, capping, etc. As will be discussed further below, not all of the steps outlined above are necessary for every device: some steps are optional and others are used only for certain layered superlattice materials. It is a feature of the invention that the prebake step 86A, the dry step 88, the RTA bake step 89, the first anneal 92, and the second anneal steps 94 and 96, and in particular the dry, RTA bake and anneal steps all involve temperatures lower than 725° C., and preferably of 700° C. and lower.

The preferred precursors solutions and their preparation in step 80 are discussed in detail in U.S. patent application Ser. No. 981,133 which is hereby incorporated by reference. Generally a metal or a metal compound is reacted with a carboxylic acid, such as 2-ethylhexanoic acid, to produce a metal hexanoate, which is dissolved in a suitable solvent or solvents, such as xylenes. Other metal-organic acid esters in addition to the 2-ethylhexanotates that may for suitable precursors when compounded with a metal are the acetates and acetylacetonates. For some metals, such as titanium, the precursor metal compound may comprise a metal alkoxide, such as titanium 2-methoxyethoxide. Other alkoxides that may be compounded with a metal and used as precursor compounds include the methoxides, ethoxides, n-propoxide, iso-propoxides, n-butoxides, iso-butoxides, tert-butoxides, 2-methoxyethoxides, and 2-ethoexyethoxides. The precursor metal compound is preferably dissolved in a solvent having a boiling point greater than the boiling point of water, i.e. 100° C. This, in combination with the heating steps in making the precursor, which preferably are performed at temperatures of 115° C. and higher, results in a precursor that is essentially anhydrous. A xylenes solvent works for most metals. For highly electropositive elements, the solvent preferably includes 2-methoxyethanol or n-butyl acetate. Some solvents that may be used, together with their boiling points, include: alcohols, such as 1-butanol (117° C.), 1-pentanol (117 ° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone heptanone (butyl ethyl ketone) (123° C.), and cyclohexanone (156° C.); esters, such as butyl acetate (127° C.), 2-methoxyethl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

The precursors of the individual metals may be made separately and then mixed, but generally they are all made together in the same container and mixed as they are made. After mixing, the precursor solution may be distilled to remove water and other undesirable impurities and by-products of the preparation process, although if the precursors and solvents are available in pure enough states, the distillation step 81 may be skipped. The solvent type and concentration may then be adjusted in step 83 either to prepare it for coating, if the coating is to be done immediately, or to provide a precursor with a long shelf life. If the solvent control steps are such as to prepare a solution with a long shelf life, then just before coating, another adjustment will usually be done to optimize the thin film. Some adjustments to produce a long shelf life and to produce high quality films are discussed in detail in U.S. patent application Ser. No. 981,133. These may include a solvent exchange step and or the addition of a co-solvent to provide a solvent that produces a better quality film than the solvent in which the precursor was stored.

In steps 85A and 86A, or steps 85B and 86B, a substrate is provided and prepared for coating. Almost any substrate that will support a thin film and is compatible with the materials and processes described herein may be used. Some of these substrates include oxidized or non-oxidized silicon or gallium arsenide semiconducting wafers, with or without integrated circuits and/or metalized layers added, plates of silicon or glass, and other electronic device chips. For the exemplary devices of this disclosure, the substrates were metalized substrates 18 as shown in FIG. 3. The fabrication of the substrate 18 is described in detail in prior application Ser. No. 981,133 referred to above, and will not be repeated herein. While platinum with a titanium adhesion layer, or platinum alone, are the metalizations used in the examples discussed, numerous other metals may be used such as platinum with an adhesion layer of tantalum, tungsten, molybdenum, chromium, nickel or alloys of these metals, and titanium nitride. Sputtering or vacuum deposition are the preferred deposition processes, though other metalization processes may be used. Heating of the substrates during the metalization deposition is effective to increase adhesion. It has been found that prebaking of the metalized substrate at a temperature that is higher than or equal to the temperature of any of the subsequent processes performed on the wafer 10, which processes are described below, is usually necessary to optimize the electronic properties of the thin film 30. The prebaking step 86A comprises baking in an oxygen atmosphere, preferably at a concentration of between 20% and 100%, and at a temperature of between 500° C. and 1000° C., and preferably 700° C., prior to the coating step 87. Preferably the wafer 10 is baked in a diffusion furnace. The substrate prebake step 86A removes water and organic impurities from the substrate surface. More importantly, the prebaking decreases the internal stress of the metal layer 28 through the annealing effect of the prebaking and the partial oxidation and interdiffusion of the adhesion layer 26 metal. All this increases the adhesion between the substrate 18 and the layered superlattice film 30 and minimizes the peeling problem. Further, if the adhesion layer 26 is a transition metal, the partial oxidation stabilizes the metal chemically. Therefore the number of mobile atoms penetrating into the layered superlattice layer 30 through the platinum layer 28 is drastically decreased, and the layered superlattice layer 30 crystallizes smoothly without defects due to the diffused ions. If the substrate is not metallized, then the silicon or other wafer is dehydrated at a lower temperature.

The precursor mixing, distillation, solvent control, and concentration control steps 81, 82, and 83 have been discussed separately and linearly for clarity. However, these steps can be combined and/or ordered differently depending on the particular liquids used, whether one intends to store the precursor or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 18. Preferably the coating is done by a spin-on process. The preferred precursor solution concentration is 0.01 to 0.50 M (moles/liter), and the preferred spin speed is between 500 rpm and 5000 rpm.

The spin-on process and the misted deposition process remove some of the solvent, but some solvent remains after the coating. This solvent is removed from the wet film in a drying step 88. At the same time, the heating causes thermal decomposition of the organic elements in the thin film, which also vaporize and are removed from the thin film. This results in a solid thin film of the layered superlattice material 30 in a precrystallized amorphous state. This dried film is sufficiently rigid to support the next spin-on coat. The drying temperature must be above the boiling point of the solvent, and preferably above the thermal decomposition temperature of the organics in precursor solution. The preferred drying temperature is between 150° C. and 400° C. and depends on the specific precursor used. The drying step may comprise a single drying step at a single temperature, or multiple step drying process at several different temperatures, such as a ramping up and down of temperature. The multiple step drying process is useful to prevent cracking and bubbling of the thin film which can occur due to excessive volume shrinkage by too rapid temperature rise. An electric hot plate is preferably used to perform the drying step 88.

The drying step 88 is optionally followed by an RTP bake step 89. Radiation from a halogen lamp, an infrared lamp, or an ultraviolet lamp provides the source of heat for the RTP bake step. In the examples, an AG Associates model 410 Heat Pulser utilizing a halogen source was used. Preferably, the RTP bake is performed in an oxygen atmosphere of between 20% and 100% oxygen, at a temperature between 450° C. and 725° C., and preferably 700° C., with a ramping rate between 1° C./sec and 200° C./sec, and with a holding time of 5 seconds to 300 seconds. Any residual organics are burned out and vaporized during the RTP process. At the same time, the rapid temperature rise of the RTP bake promotes nucleation, i.e. the generation of numerous small crystalline grains of the layered superlattice material in the solid film 30. These grains act as nuclei upon which further crystallization can occur. The presence of oxygen in the bake process is essential in forming these grains.

The thickness of a single coat, via the spin process or otherwise, is very important to prevent cracking due to volume shrinkage during the following heating steps 88, 89, and 92. To obtain a crack-free film, a single spin-coat layer must be less than 2000 Å (200 nanometers) after the bake step 89. Therefore, multiple coating is necessary to achieve film thicknesses greater than 2000 Å. The preferred film fabrication process includes RTP baking for each spin-on coat. That is, as shown in FIG. 1, the substrate 18 is coated, dried, and RTP baked, and then the process 90 is repeated as often as necessary to achieve the desired thickness. However, the RTP bake step is not essential for every coat. One RTP bake step for every two coats is practical, and even just one RTP bake step at the end of a series of coats is strongly effective in improving the electronic properties of most layered superlattice ferroelectrics. For a limited number of specific precursor/layered superlattice material compositions, particularly ones utilizing concentrations of bismuth in excess of stoichiometry, the RTP bake step 89 is not necessary.

Once the desired film thickness has been obtained, the dried and preferably baked film is annealed in step 92, which is referred to as a first anneal to distinguish it from subsequent anneals. The first anneal is preferably performed in an oxygen atmosphere in a furnace. The oxygen concentration is preferably 20% to 100%, and the temperature is above the crystallization temperature of the particular layered superlattice material 30. To prevent evaporation of elements from the layered superlattice material 30 and to prevent thermal damage to the substrate, including damage to integrated circuits already in place, the annealing temperature is preferably kept below 725° C. Preferably the annealing for strontium bismuth tantalate is done at about 700° C. for five hours, and is in a similar range for most other layered superlattice materials. If five hours is too long for a particular integrated circuit device, then the first anneal may be reduced. However, less than 3 hours of annealing at 700° C. results in unsaturated hysteresis loops. Three hours annealing provides adequate saturation, and additional annealing increases the polarizability, 2Pr. Again, the presence of oxygen is important in this first anneal step. The numerous nuclei, small grains generated by the RTP bake step, grow, and a well-crystallized ferroelectric film is formed under the oxygen-rich atmosphere.

After the first anneal, the second or top electrode 32 is formed. Preferably the electrode is formed by RF sputtering of a platinum single layer, but it also may be formed by DC sputtering, ion beam sputtering, vacuum deposition or other appropriate deposition process. If desirable for the electronic device design, before the metal deposition, the layered superlattice material 30 may be patterned using conventional photolithography and etching, and the top electrode 32 is then patterned in a second process after deposition. In the examples described herein, the top electrode 32 and layered superlattice material 30 are patterned together using conventional photolithography techniques and ion beam milling.

As deposited, the adhesion of the top electrode 32 to the layered superlattice material is usually weak. Preferably, the adhesion is improved by a heat treatment. The wafer 10 including the layered superlattice film 30 covered by the top electrode 32 may be annealed before the patterning step 95 described above in a heat treatment designated in FIG. 1 as the second anneal (1) step 94, after the patterning step 95 by a heat treatment designated in FIG. 1 as the second anneal (2) step 96, or both before and after the patterning step 95. The second anneal is preferably performed in an electric furnace at a temperature between 500° C. and the first anneal temperature. A second anneal below 500° C. does not improve the adhesion of electrode 32, and the resulting capacitor devices are sometimes extremely leaky, and shorted in the worst cases.

The second anneal releases the internal stress in the top electrode 32 and in the interface between the electrode 32 and the layered superlattice material 30. At the same time, the second annealing step 94, 96 reconstructs microstructure in the layered superlattice material 30 resulting from the sputtering of the top electrode, and as a result improves the properties of the material. The effect is the same whether the second anneal is performed before or after the patterning step 95. The effect of oxygen ambient during the second anneal is not as clear as it is in the case of RTP bake 89 and the first anneal 92, because the layered superlattice material 30 is covered by the top electrode and not exposed to the ambient atmosphere. With regard to most electrical properties, inert gas, such as helium, argon, and nitrogen may be used with approximately the same result as with oxygen. However, it has been found that an oxygen atmosphere during the second anneal improves the crystallographic order at the interface of the electrode 32 and layered superlattice material 30 as well as the symmetry of the hysteresis curve.

3. Examples of the Fabrication Process and Property Dependence

Figure 5:
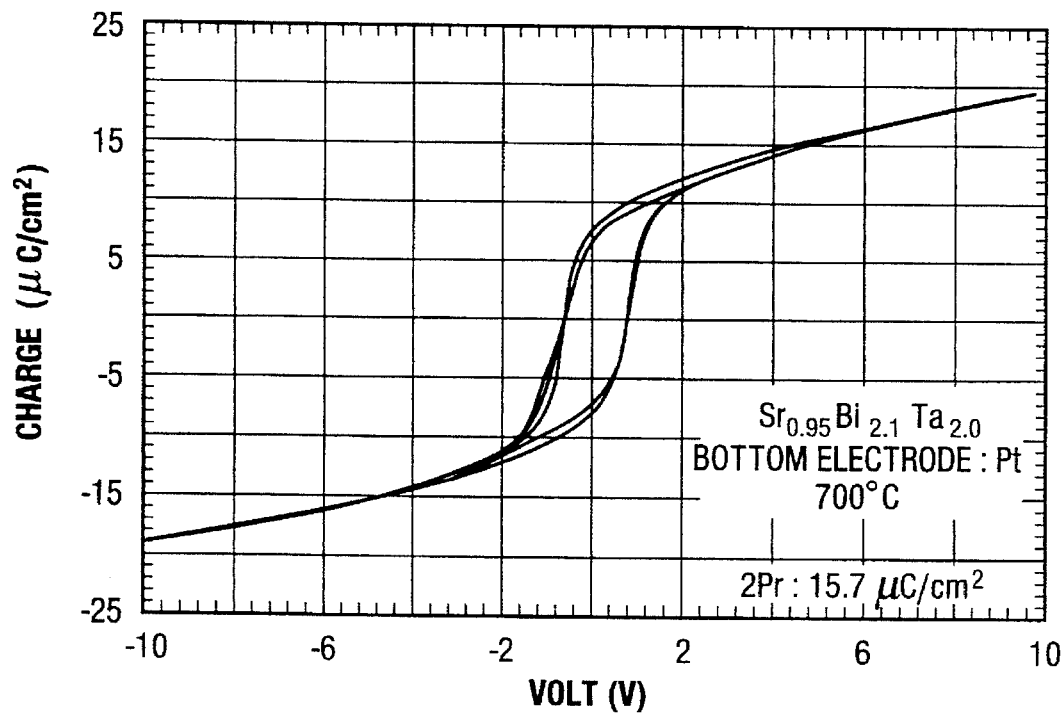
FIGS. 5 through 7 show hysteresis curves for 2, 4, 6, 8, and 10 volts for three samples of strontium bismuth tantalate formed on a platinum electrode with 700° C. anneal processes.
Figure 11:
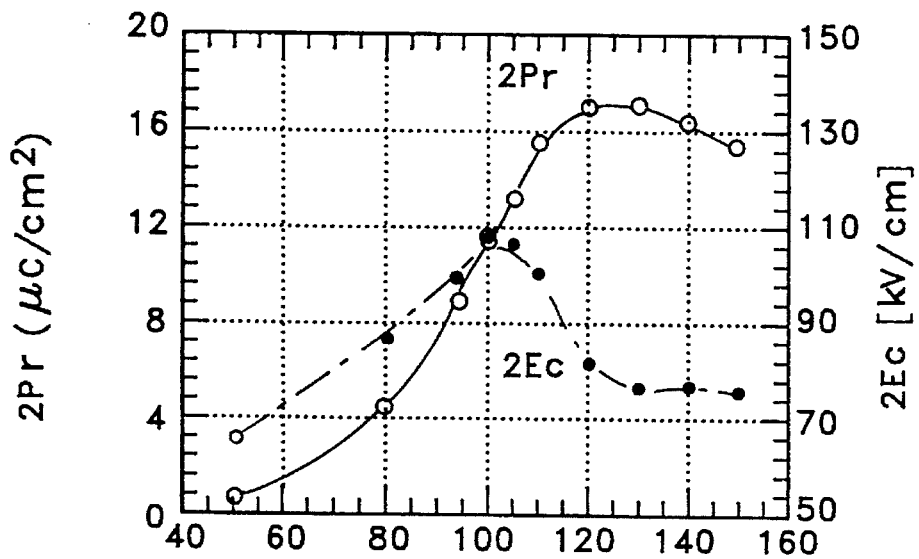
FIG. 11 shows graphs of 2Pr and 2Ec for samples of strontium bismuth tantalate fabricated utilizing precursor solutions having different bismuth content.

Below, examples of the fabrication process according to the invention as applied to a wafer 10 as shown in FIGS. 2 and 3 are given. Following each of the examples, there is a discussion of the electrical/electronic properties illustrated in the figures. The figures include hysteresis curves, such as FIG. 5, and material endurance or "fatigue" curves such as FIG. 6. The hysteresis curves are given in terms of the applied voltage in volts versus the polarization charge in microcoulombs per centimeter squared. Generally, the hysteresis is shown for five different voltages generally, 2 volts, 4 volts, 6 volts, 8 volts and 10 volts. As is well-known, hysteresis curves which suggest good ferroelectric properties tend to be relatively boxy and long in the direction of polarization, rather than thin and linear. The hysteresis measurements were all made on an uncompensated Sawyer-Tower circuit unless otherwise noted. The endurance or "fatigue" curves give the polarization charge, 2Pr, in microcoulombs per square centimeter versus the number of cycles. The polarization charge 2Pr is the charge created by switching a capacitor such as 16 from a state where it is fully polarized in one direction, say the upward vertical direction in FIG. 3, to the opposite fully polarized state, which would be the downward vertical direction in FIG. 3. Here, "fully polarized" means the state in which the ferroelectric material has been polarized fully and the field removed. In terms of an hysteresis curve, such as shown in FIG. 5, it is the difference between $Pr_+$, the point where the hysteresis curve crosses the positive polarization axis (y-axis), and $Pr_-$, the point where the hysteresis curve crosses the negative polarization axis. Unless otherwise noted, the value of 2Pr given is taken from the hysteresis measurement at the highest voltage. The higher the value of 2Pr, the better will be the performance of the material in ferroelectric memories and other applications. A cycle is defined as the capacitor, such as 16, being switched through one square pulse. This polarization, 2Pr, is approximately twice the remnant polarization, Pr. FIG. 11 also shows the value 2Ec, which is given in kilovolts per cm, versus the amount of bismuth in the stoichiometry. The parameter 2Ec is equal to the sum of the coercive field on the positive side, Ec+, and the coercive field on the negative side, Ec−, upon a voltage change, generally taken as from −6 to +6 volts for the figures shown. The coercive field is a measure of the size of the field that is required to switch the material from one polarization state to another. For a practical electronic device, it should be high enough that stray fields will not cause polarization switching, but if it is too high, large voltages will be required to operate the device. Other parameters and terms used in the figures and discussion should be clear from the context.

EXAMPLE 1

A wafer 10 including a number of capacitors 12, 14, 16, etc. was fabricated in which the layered superlattice material 30 was strontium bismuth tantalate. The precursor solution comprised strontium 2-ethylhexanoate, bismuth 2-ethylhexanoate, and tantalum 2-ethylhexanoate in a xylenes solvent. The plural "xylenes" is used instead of the singular "xylene", because commercially available xylene includes three different fractionations of xylene. The three metal 2-ethylhexanoates were mixed in a proportion such that the strontium, tantalum were present in the mixed precursor in proportions given by the formula $Sr_{0.95}Bi_{2.1}Ta_{2.0}O_9$. That is, the precursor included 2.1 mole-equivalents of bismuth for each 0.95 mole-equivalents of strontium and 2.0 mole-equivalents of tantalum. The molarity of the solution was approximately 0.2 moles per liter. The precursor was diluted to 0.13 moles per liter by the addition of n-butyl acetate. A substrate 18 comprising a single crystal silicon layer 22, a 500 nanometer (nm) thick layer 24 of silicon dioxide, and a 200 nm thick layer 28 of platinum was prebaked at 700° C. in a diffusion furnace for 30 minutes with an oxygen flow of 6 liters/min. An eyedropper was used to place 1 ml of the $Sr_{0.95}Bi_{2.1}Ta_{2.0}O_9$ precursor solution on the substrate 18. The wafer was spun at 1500 RPM for 30 seconds. The wafer 10 was then placed on a hot plate and baked in air at about 150° C. for 5 minutes and then at 170° C. for another 5 minutes. The wafer 10 was then RTP baked at 700° C. with a ramping rate of 125° C./sec, a hold time of 30 seconds, a natural cool time of 6 minutes, and an ambient oxygen flow of approximately 100–200 cc/minute. The steps from using an eyedropper to deposit solution on the wafer through RTP baking were repeated for another coat. The wafer was then transferred to a diffusion furnace and annealed at 700° C. in an oxygen flow of 6 l/min for five hours. The top layer 32 of 200 nm platinum was sputtered, a resist was applied, followed by a standard photo mask process, an ion mill etch, an IPC strip and a second anneal at 700° C. in an oxygen flow of about 6 l/min for 30 minutes. The final thickness of the layered superlattice film 30 was about 1400 Å.

FIG. 5 shows initial hysteresis curves measured at 2, 4, 6, 8 and 10 volts for the strontium bismuth titanate sample fabricated in Example 1. The hysteresis curves are vertically elongated and boxy suggesting excellent performance in an integrated circuit memory. The curves for different voltages lie nearly on top of one another, indicating little variability in performance with voltage, again an excellent prognostication for memory performance. The polarizability, 2Pr, was measured to be 15.7 microcoulombs/cm², which is excellent as compared to the prior art.

Another sample was made as described in Example 1, except the precursor was mixed in the proportion of 2.1 mole-equivalents of bismuth for each 0.9 mole-equivalents of strontium and 2.0 mole-equivalents of tantalum. The hysteresis curves were measured at the same voltages with the results shown in FIG. 6. The results are similar, except the polarizability has increased to 18.0 microcoulombs/cm². When the proportions of the metals in the precursor was changed to 2.2 mole-equivalents of bismuth for each 0.85 mole-equivalents of strontium and 2.0 mole equivalents of tantalum, the polarizability increased to 21.9 microcoulombs/cm², with the hysteresis curves still being excellent as shown in FIG. 7. When a sample capacitor with a strontium bismuth titanate precursor of the same molar proportions as for the sample of FIG. 6 was made except having a bottom electrode made of a 20 nm titanium adhesion layer 26 followed by a 200 nm platinum layer, the polarizability dropped to 20.8 microcoulombs/cm², which still is excellent, with the hysteresis curves also remaining excellent as shown in FIG. 8.

Figure 9:
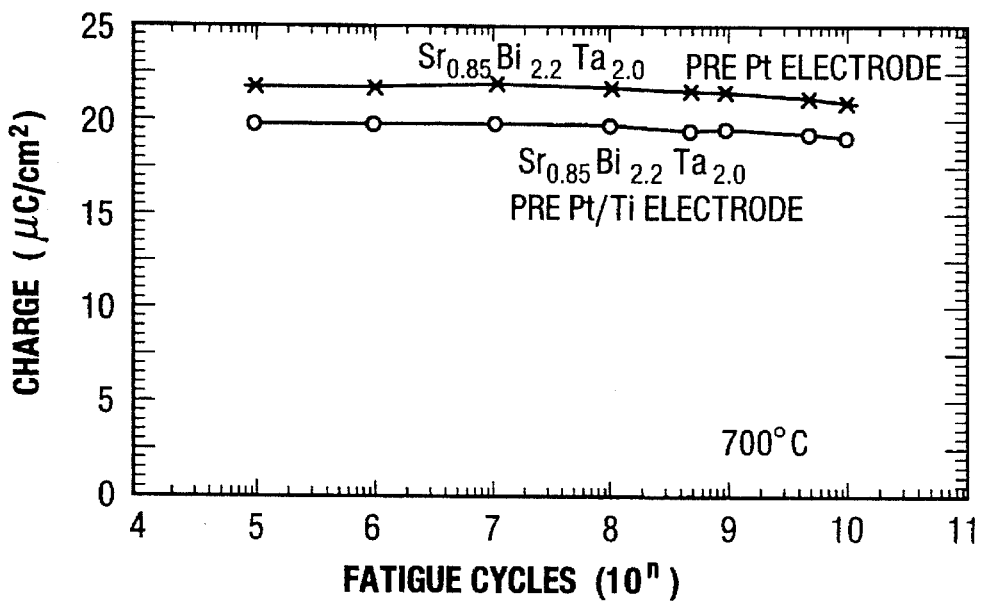
FIG. 9 shows graphs of 2Pr versus RTP bake temperature for the respective sets of hysteresis curves of FIGS. 7 and 8.

The polarizability, 2Pr, was measured as a function of switching cycles, and the result is graphed in FIG. 9. Almost no fatigue occurs out to $10^{10}$ cycles. This result is at least ten thousand times better than the best fatigue results measured in the prior art PZT material, and there is no indication that there will be any significant fatigue beyond $10^{10}$ cycles. The fatigue with and without the titanium adhesion layer is about the same, with the only difference being that the polarizability stays a little lower for the Pt/Ti electrode.

It has been found that the best quality strontium bismuth tantalate devices in a low temperature process result with a strontium concentration of between 0.8 and 1.0 mole-equivalents, a bismuth concentration of between 2.00 and 2.3 mole-equivalents, and a tantalum concentration of between 1.9 and 2.1 mole-equivalents. That is, the precursor containing u mole-equivalents of strontium, v mole-equivalents of bismuth, and w mole-equivalents of tantalum, where $0.8 \leq u \leq 1.0$, $2.0 \leq v \leq 2.3$, and $1.9 \leq w \leq 2.1$ gives the best results.

As a comparison with a higher temperature process, two further samples were made using a process as in Example 1, except that the RTP hold temperature was 725° C., the first anneal 92 was at 800° C. for 1 hour, and the second anneal step 96 was at 800° C. In both samples the mole-equivalent proportion of the three metals was 2.2 mole-equivalents of bismuth for each 1.0 mole-equivalents of strontium and 2.0 mole-equivalents of tantalum. In one sample the bottom electrode included only a 200 nm platinum layer 28, and in the other sample the bottom electrode included both the 20 nm titanium adhesion layer 26 and the 200 nm platinum layer 28. The results for the two samples are shown in FIGS. 13 and 14, respectively.

Figure 6:
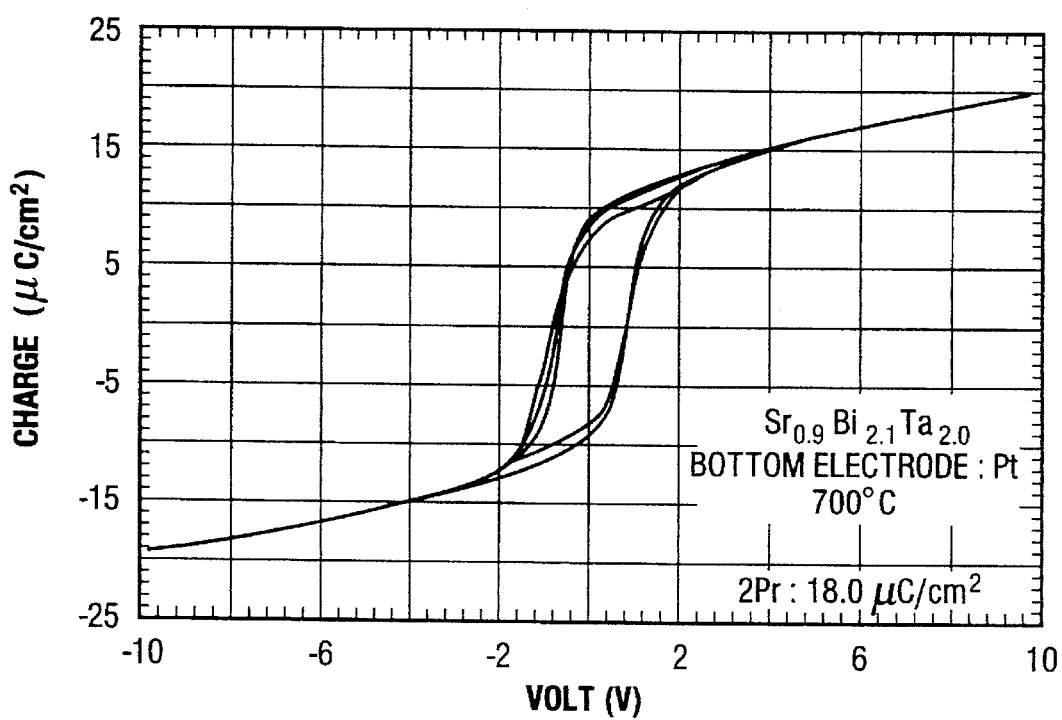
Figure 7:
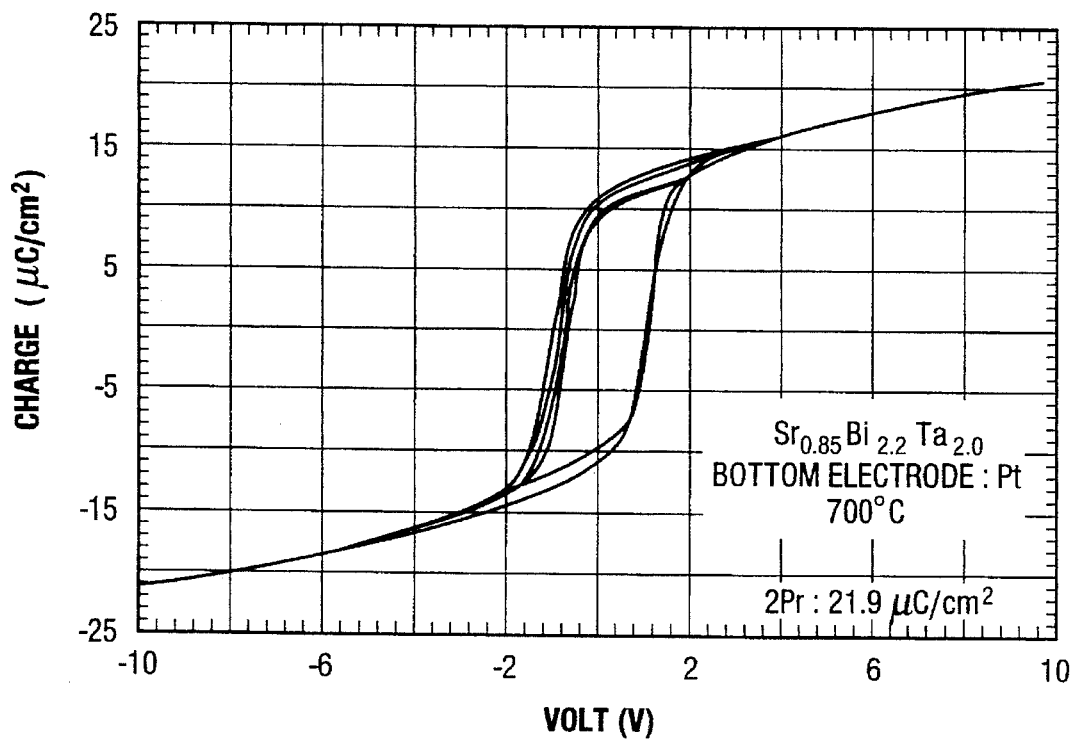
Figure 8:
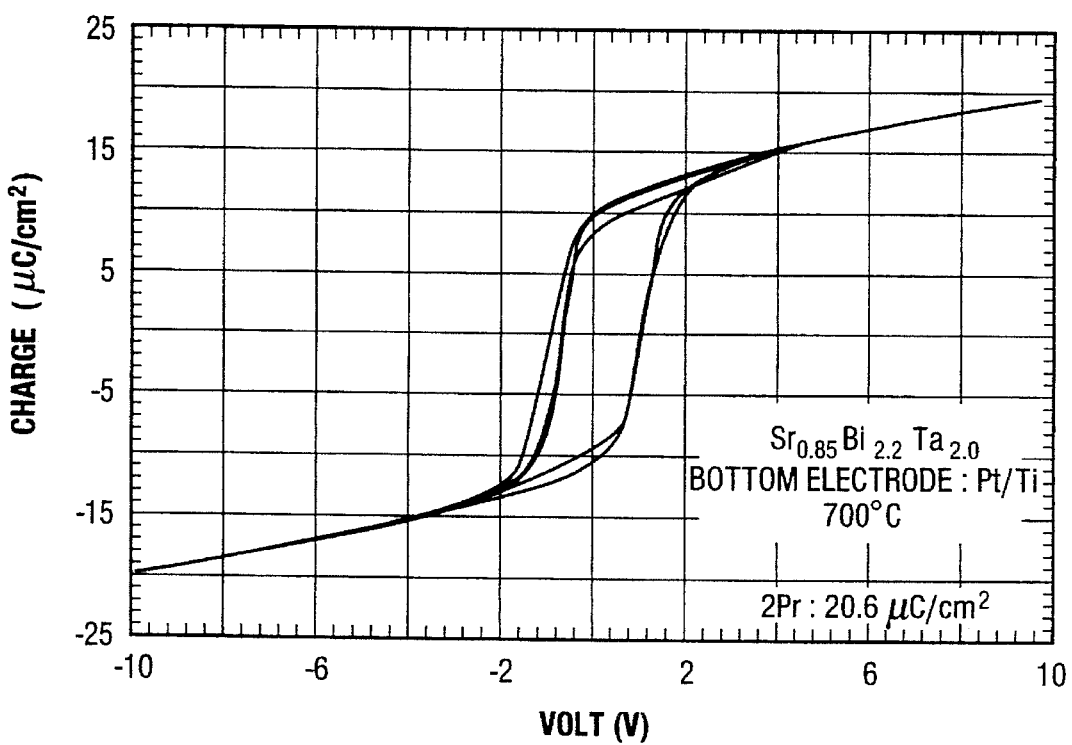
FIG. 8 shows hysteresis curves for 2, 4, 6, 8, and 10 volts for a sample of strontium bismuth tantalate formed on a Pt/Ti electrode with 700° C. anneal processes.
Figure 13:
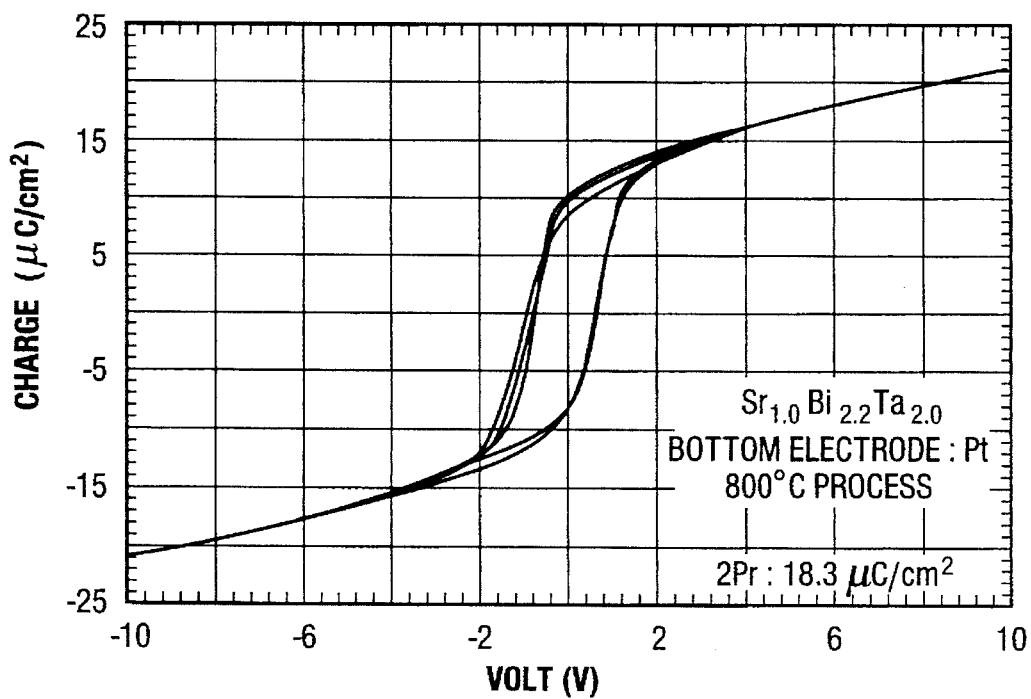
FIG. 13 shows 2, 4, 6, 8, and 10 volt hysteresis curves for a sample of strontium bismuth tantalate formed on platinum with 800° C. anneal processes.
Figure 14:
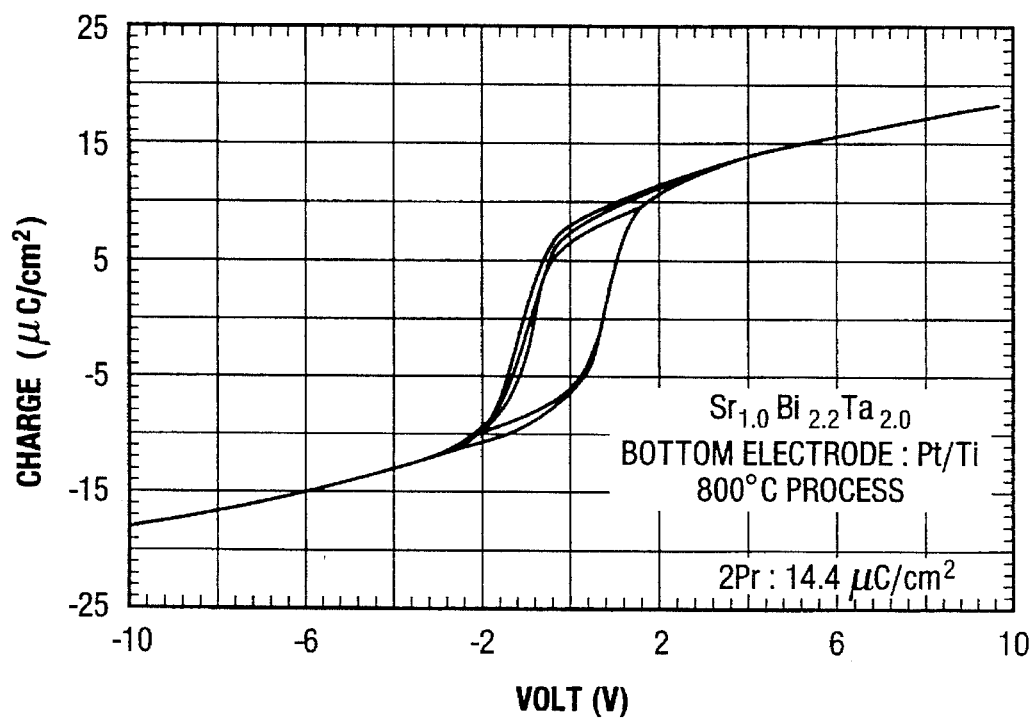
FIG. 14 shows hysteresis curves for 2, 4, 6, 8, and 10 volts for a sample of strontium bismuth tantalate formed on Pt/Ti with 800° C. anneal processes.

The polarizability in FIG. 13 is about that of FIG. 6, as one would expect because the mole-equivalency ratio of the bismuth and strontium is closer to that of FIG. 6 than that in FIGS. 5 and 7. However, when the electrode is changed to the Pt/Ti electrode, the polarizability, as shown in FIG. 14, drops much more than it does for the 700° C. process. Thus, the 700° C. process is much better with the Pt/Ti electrode. This magnifies the significance of result of FIG. 8. That is, the 700° C. process with the mole-equivalency ratio between bismuth and strontium being 2.2/0.85 gives superior results for the Pt/Ti electrode that are only slightly less than that of the platinum-only electrode results. This is believed to be due to the fact that the titanium does not migrate as much at the lower temperature.

Whatever, the cause, the result holds great promise for practical memories. The manufacturability and reliability of a memory is significantly enhanced by the titanium adhesion layer. However, up to now, it was believed that the enhanced manufacturability and reliability went hand-in-hand with significantly lower electrical properties. However, this is now shown not to be the case for the sample with the parameters of FIG. 8. Now, an extremely high polarizability is obtainable with the Pt/Ti electrode by using the 700° C. process. In fact, contrary to what was believed to be true in the prior art, with the Pt/Ti electrode, the lower temperature process provides a higher polarizability.

To investigate the effect of RTP baking temperature, samples were fabricated as described in Example 2.

EXAMPLE 2

A series of wafers 10 including a number of capacitors 12, 14, 16, etc. was fabricated in which the layered superlattice material 30 was strontium bismuth tantalate. The precursor solution comprised strontium 2-ethylhexanoate, bismuth 2-ethylhexanoate, and tantalum 2-ethylhexanoate in a xylenes solvent. The molarity of the solution was approximately 0.2 moles per liter. The precursor was diluted to 0.13 moles per liter by the addition of n-butyl acetate. A substrate 18 comprising a single crystal silicon layer 22, a 5000 Å thick layer 24 of silicon dioxide, a 200 Å thick layer 26 of titanium, and a 2000 Å, thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 1500 RPM for 40 seconds. The wafer 10 was then placed on a hot plate and baked in air at about 170° C. for 5 minutes and then at 250° C. for another 5 minutes. The wafer 10 was then RTP baked at temperatures ranging from 0° C. (no RTA) to 800° C. with a ramping rate of 125° C./sec, and a hold time of 30 seconds, a natural cool time of 6 minutes, and an ambient oxygen flow of approximately 100–200 cc/minute. The steps from using an eyedropper to deposit solution on the wafer through RTP baking were repeated for another coat. The wafer was then transferred to a diffusion furnace and annealed at 800° C. in an oxygen flow of 6 l/min for 60 minutes. The top layer 32 of 2000 Å platinum was sputtered, a resist was applied, followed by a standard photo mask process, an ion mill etch, an IPC strip and a second anneal at 800° C. in an oxygen flow of about 6 l/min for 30 minutes. The final thickness of the layered superlattice film 30 was 2000 Å.

Figure 10:
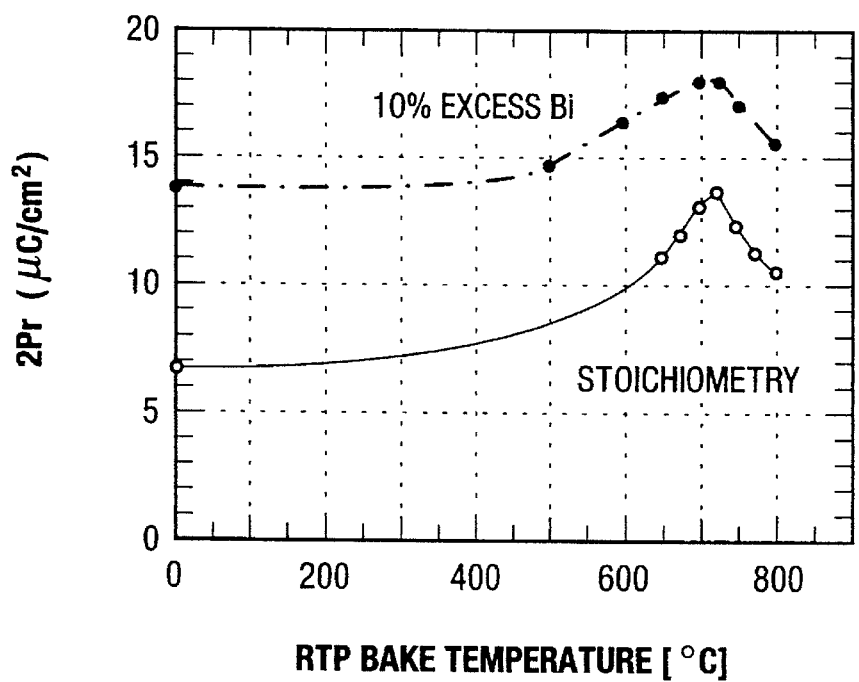
FIG. 10 shows graphs of 2Pr and 2Ec for samples of strontium bismuth tantalate with a stoichiometric precursor and with a precursor including 10% excess bismuth.

In one series of samples, using the process of Example 2, the precursors were mixed so that the proportions of strontium, bismuth and tantalum were stoichiometric, while in another series 10% extra bismuth was added. In the stoichiometric samples, the thickness of the layered superlattice layers 30 was between 2100 Å and 2200 Å. In the 10% excess bismuth samples the thickness was about 2000 Å. The hysteresis curves were measured a 2, 4, and 6 volts for both series of samples. FIG. 10 shows a graph of 2Pr measured from the 6 volt hysteresis curves. For both the stoichiometric samples and the 10% excess bismuth samples, the value of 2Pr increases dramatically above 500° C., and has a maximum at about 725° C. ±25° C. Thus, decreasing the RTP bake to 700° C. has little effect. The optimum RTP baking temperature has been found to vary a little with the particular layered superlattice material. Further, from FIG. 9, the value of 2Pr is consistently and significantly higher for the 10% excess bismuth samples than for the stoichiometric samples. This superior performance in the samples with excess bismuth in the precursor solution is believed to be due to the fact that bismuth and bismuth oxide have a higher vapor pressure (lower vapor point) than the other metals in the layered superlattice material and the oxides of these other metals. Since the thin film preparation process includes several heating steps, some at relatively high temperatures, the bismuth and bismuth oxide are easily vaporized during the fabrication process. As a result, some bismuth is lost during the process, and if a stoichiometric proportion of bismuth was present in the mixed precursor, there will be less than a stoichiometric amount in the completed thin film, and the resulting layered superlattice material will have many defects, especially on the surface, with resulting degradation of the crystalline state and the ferroelectric properties that depend on that state. The excess bismuth compensates for the loss of bismuth during fabrication, resulting in a more nearly stoichiometric thin film and improved ferroelectric properties.

From the data of FIG. 9 another fact becomes apparent. RTP bake improves 2Pr for the materials formed from stoichiometric precursors by more than 100%. RTP bake also improves the performance of the excess bismuth materials, but only by about 30%. Thus RTP bake is essential for the materials formed from stoichiometric precursors, but not essential for materials formed from precursors with excess bismuth.

EXAMPLE 3

A series of ten wafers 10 including a number of capacitors 12, 14, 16, etc. was fabricated in which the layered superlattice material 30 was strontium bismuth tantalate ($SrBi_2Ta_2O_9$). The precursor solution comprised strontium 2-ethylhexanoate, bismuth 2-ethylhexanoate, and tantalum 2-ethylhexanoate in a xylenes solvent. The three metal 2-ethylhexanoates were mixed in a proportion such that the strontium and tantalum were present in the mixed precursor in stoichiometric proportions, while the bismuth was present in the following proportions different percentage of stoichiometry for each of the ten wafers: 50%; 80%; 95%; 100%; 105%; 110%; 120%; 130%; 140%; and 150% of stoichiometry. The molarity of the solution was approximately 0.09 moles per liter. A substrate 18 comprising a single crystal silicon layer 22, a 5000 Å thick layer 24 of silicon dioxide, a 200 Å thick layer 26 of titanium, and a 2000 Å thick layer 28 of platinum was prebaked at 800° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 2000 RPM for 40 seconds. The wafer 10 was then placed on a hot plate and baked in air at about 180° C. for 5 minutes and then at 250° C. for another 5 minutes. The wafer 10 was then RTP baked at 725° C. with a ramping rate of 125° C./sec, a hold time of 30 seconds, a natural cool time of 6 minutes, and an ambient oxygen flow of about 100–200 cc/minute. The steps from using an eyedropper to deposit solution on the wafer through RTP baking were repeated for another coat. The wafer was then transferred to a diffusion furnace and annealed at 800° C. in an oxygen flow of 6 l/min for 30 minutes. The top layer 32 of 2000 Å platinum was sputtered, a resist was applied, followed by a standard photo mask process, an ion mill etch, an IPC strip and a second anneal at 800° C. in an oxygen flow of 6 l/min for 30 minutes. The final thickness of the layered superlattice film 30 was 1900 Å to 2100 Å.

Figure 12:
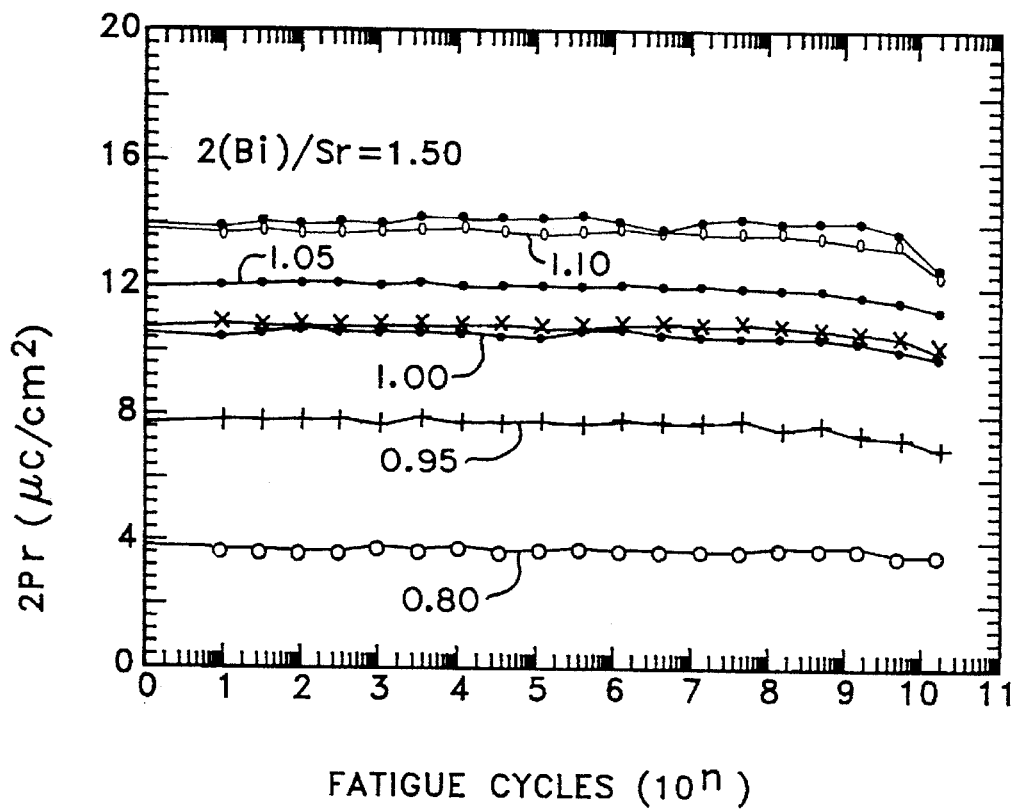
FIG. 12 shows graphs of 2Pr versus number of cycles for some of the samples of FIG. 11.

Hysteresis curves for each of the ten samples made according to the process of Example 3 were measured and the values of 2Pr and 2Ec taken from the 6 volt hysteresis curves are plotted in FIG. 11. The graph shows that the material is clearly ferroelectric above 50% of stoichiometry. As the amount of bismuth increases, so does 2Pr and 2Ec. At about 100% of stoichiometry, 2Ec peaks and then decreases steadily until it becomes relatively flat at about 130% of stoichiometry. 2Pr peaks at about 120% of stoichiometry and then decreases gradually. The upper limit of bismuth concentration is defined by the electrical shorting of the thin film due to the degradation of film quality caused by excessive grain growth or migration of excess bismuth. FIG. 12 is a graph showing the fatigue of the samples of Example 2 having the different bismuth concentrations. All of the samples show excellent resistance to fatigue, which property does not depend on the bismuth content as long as the material is ferroelectric.

The excellent properties for the films having excess bismuth are also applicable to other elements which form high vapor pressure compounds during the process of fabricating layered superlattice materials. In addition to bismuth, other such elements are lead, thallium and antimony.

Figure 15:
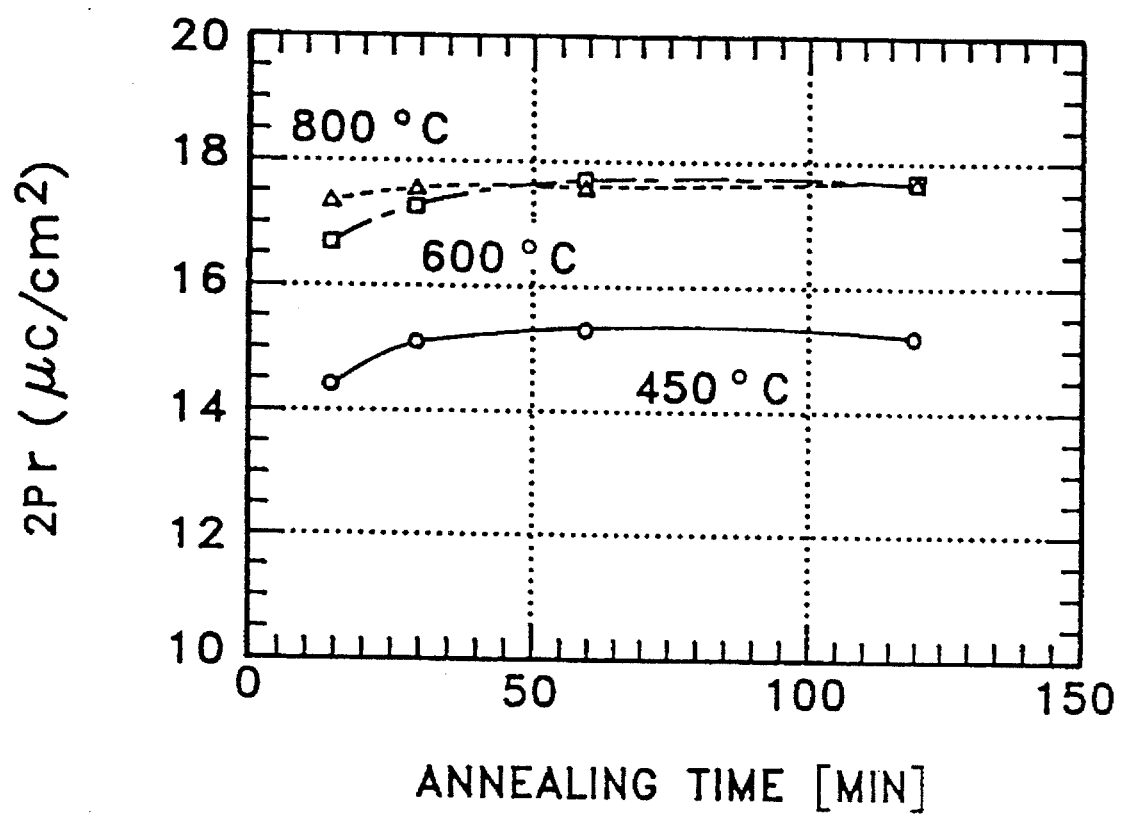
FIG. 15 shows graphs of 2Pr versus second anneal time for samples of strontium bismuth tantalate prepared with 10% excess bismuth and different second anneal temperatures.

A series of twelve samples were fabricated as described in Example 2 except that the drying temperature on the hot plate was 180° C. and the second anneal was performed for each combination of the following temperatures and times: 450° C., 600° C., and 800° C.; for 15 minutes, 30 minutes, 60 minutes, and 120 minutes. The measured value of 2Pr is plotted in FIG. 15 for each series of times at a given temperature. The 600° C. anneal shows an essentially equal improvement over the 450° C. anneal for every anneal time. The 600° C. anneal shows results equal to the 800° C. anneal for times longer than about 45 minutes.

As discussed in detail in the copending applications mentioned above, sample thin film capacitors, having thicknesses of about 2000 Å suitable for use in integrated circuits, have also been made of the layered superlattice materials strontium bismuth niobate, strontium bismuth titanate, strontium bismuth zirconate and solid solutions of the above materials, all of which showed excellent ferroelectric properties when made with similar fabrication process parameters to those described above. Likewise, sample thin film capacitors, having thicknesses of about 2000 Å suitable for use in integrated circuits, made of the layered superlattice materials lead bismuth niobate, barium bismuth tantalate, lead bismuth tantalate, and barium bismuth niobate, all of which showed excellent high dielectric constant properties when made with similar fabrication process parameters to those described above.

There has been described processes and compositions for making electronic devices utilizing layered superlattice materials using only process temperatures of 725° C. or less. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. For example, now that it has been shown that the low temperature process is superior for use with titanium/platinum electrodes, these processes can be combined with conventional processes using various known barrier layers, etc. to provide variations on the processes described. It is also evident that the steps recited may in some instances be performed in a different order. Or equivalent structures and process may be substituted for the various structures and processes described. Or a variety of different dimensions and materials may be used. Consequently, the invention is to be construed as embracing each and every novel feature and novel combination of features present in and/or possessed by the fabrication processes, electronic devices, and electronic device manufacturing methods described.

We claim:

1. A method of fabricating a layered superlattice material comprising:

providing a substrate, and a precursor containing metal moieties in effective amounts for spontaneously forming a layered superlattice material upon heating said precursor;

applying said precursor to said substrate; and heating said precursor on said substrate to a temperature of between 600° C. and 700° C. to form said layered superlattice material on said substrate.

2. A method as in claim 1 wherein said step of heating comprises rapid thermal processing at a temperature of about 700° C. and then annealing at a temperature of about 700° C.

3. A method as in claim 2 wherein said step of annealing comprises annealing for at least five hours.

4. A method as in claim 2 wherein said substrate comprises a first electrode, and further comprising the steps of forming a second electrode on said layered superlattice material, after said step of annealing, to form a capacitor, and subsequently performing a second anneal at a temperature of about 700° C.

5. A method as in claim 1 wherein said precursor includes u mole-equivalents of strontium, v mole-equivalents of bismuth, and w mole-equivalents of tantalum, and $0.8 \leq u \leq 1.0$, $2.0 \leq v \leq 2.3$, and $1.9 \leq w \leq 2.1$.

6. A method as in claim 1 wherein said step of providing a substrate comprises forming an adhesion layer and then forming an electrode on said adhesion layer.

7. A method as in claim 6 wherein said adhesion layer comprises titanium and said electrode comprises platinum.

8. A method of fabricating a layered superlattice material comprising:

providing a substrate, and a precursor containing metal moieties in effective amounts for spontaneously forming a layered superlattice material upon drying and annealing said precursor;

applying said precursor to said substrate;

drying said precursor to form a solid material on said substrate; and annealing said solid material at a temperature of between 600° C. and 725° C. to form said layered superlattice material on said substrate.

9. A method as in claim 8 wherein said step of drying comprises rapid thermal processing said precursor at a temperature of up to 725° C.

10. A method as in claim 9 wherein said rapid thermal processing temperature is about 700° C.

11. A method as in claim 8 wherein said annealing temperature is about 700° C.

12. A method as in claim 11 wherein said step of annealing comprises annealing said material for at least 3 hours.

13. A method as in claim 5 wherein said material is annealed for at least five hours.

14. A method as in claim 8 wherein said substrate comprises a first electrode, and further comprising the steps of forming a second electrode on said layered superlattice material, after said step of annealing, to form a capacitor, and subsequently performing a second anneal at a temperature of up to 725° C.

15. A method as in claim 14 wherein said second anneal temperature is about 700° C.

16. A method as in claim 8 wherein said layered superlattice material comprises strontium bismuth tantalate.

17. A method as in claim 16 wherein said precursor includes u mole-equivalents of strontium, v mole-equivalents of bismuth, and w mole-equivalents of tantalum, and $0.8 \leq w \leq 1.0$, $2.0 \leq v \leq 2.3$, and $1.9 \leq w \leq 2.1$.

18. A method as in claim 17 wherein u=0.9, v=2.1, and w=2.

19. A method as in claim 17 wherein u=0.85, v=2.2, and w=2.

20. A method as in claim 8 wherein said step of providing a substrate comprises forming an adhesion layer and then forming an electrode on said adhesion layer.

21. A method as in claim 20 wherein said adhesion layer comprises titanium and said electrode comprises platinum.

22. A method of fabricating layered superlattice material comprising:

providing a substrate and a precursor containing metal moieties in effective amounts for spontaneously forming a layered superlattice material upon heating said precursor;

forming an adhesion layer on said substrate;

forming an electrode on said adhesion layer;

applying said precursor to said substrate; and heating said precursor on said substrate to a temperature of about 700° C. to form said layered supperlattice material on said substrate.

23. A method as in claim 22 wherein said step of heating comprises rapid thermal processing at a temperature of 700° C. and then annealing at a temperature of about 700° C.

24. A method as in claim 23 wherein said substrate comprises a first electrode, and further comprising the steps of forming a second electrode on said layered superlattice material, after said step of annealing, to form a capacitor, and subsequently performing a second anneal at a temperature of about 700° C.

25. A method as in claim 23 wherein said step of annealing comprises annealing for at least 3 hours.

26. A method as in claim 23 wherein said step of annealing comprises annealing for at least 5 hours.

27. A method as in claim 22 wherein said adhesion layer comrpises titanium and said electrode comprises platinum.

28. A method of fabricating a layered superlattice material comprising:

providing a substrate, and a precursor containing u mole-equivalents of strontium, v mole-equivalents of bismuth, and w mole-equivalents of tantalum, where $0.8 \leq u \leq 1.0$, $2.0 \leq v \leq 2.3$, and $1.9 \leq w \leq 2.1$;

applying said precursor to said substrate; and heating said precursor on said substrate to form a thin film of strontium bismuth tantalate on said substrate.

29. A method as in claim 28 wherein u=0.85, v=2.2, and w=2.

30. A method as in claim 28 wherein u=0.9, v=2.1, and w=2.

* * * * *

UNITED STATES PATENT AND TRADEMARK OFFICE
CERTIFICATE OF CORRECTION

PATENT NO. : 5,508,226

DATED : April 16, 1996

INVENTOR(S) : Ito, et al.

It is certified that error appears in the above-identified patent and that said Letters Patent is hereby corrected as shown below:

Column 17    Line 64 change "claim 5" to --claim 12--

Signed and Sealed this

Third Day of December, 1996

Attest:

BRUCE LEHMAN

Attesting Officer    Commissioner of Patents and Trademarks